US006884717B1

(12) United States Patent
Desalvo et al.

(10) Patent No.: US 6,884,717 B1
(45) Date of Patent: Apr. 26, 2005

(54) STIFFENED BACKSIDE FABRICATION FOR MICROWAVE RADIO FREQUENCY WAFERS

(75) Inventors: Gregory C. Desalvo, Bellbrook, OH (US); Tony K. Quach, Lebanon, OH (US); John L. Ebel, Beavercreek, OH (US); Anders P. Walker, Wilmington, OH (US); Paul D. Cassity, Covington, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 33 days.

(21) Appl. No.: 10/034,723

(22) Filed: Jan. 3, 2002

(51) Int. Cl.$^7$ ............................................. H01L 21/44

(52) U.S. Cl. ..................... 438/667; 438/460; 438/464

(58) Field of Search ................................. 438/460, 464, 438/667, 977, FOR 477, FOR 485, 463, 606, 107, 620, 712, 718, 728, 733, 742

(56) References Cited

U.S. PATENT DOCUMENTS

| | | | |
|---|---|---|---|
| 4,401,054 A | | 8/1983 | Matsuo et al. |
| 4,431,898 A | | 2/1984 | Reinberg et al. |
| 4,438,368 A | | 3/1984 | Abe et al. |
| 5,463,246 A | * | 10/1995 | Matsunami ................ 257/621 |
| 5,512,496 A | | 4/1996 | Chau et al. |
| 5,528,080 A | * | 6/1996 | Goldstein .................. 257/741 |
| 5,972,781 A | | 10/1999 | Wegleiter et al. |
| 6,162,702 A | * | 12/2000 | Morcom et al. ............ 438/459 |
| 6,175,287 B1 | | 1/2001 | Lampen et al. |
| 6,207,005 B1 | | 3/2001 | Henley et al. |
| 6,218,640 B1 | | 4/2001 | Selitser |
| 6,246,010 B1 | | 6/2001 | Zenner et al. |
| 6,257,168 B1 | | 7/2001 | Ni et al. |
| 6,258,287 B1 | | 7/2001 | Martin et al. |
| 6,297,131 B1 | * | 10/2001 | Yamada et al. ............. 438/464 |
| 6,358,762 B1 | * | 3/2002 | Kohno et al. ............... 438/17 |
| 6,440,822 B1 | * | 8/2002 | Hayama et al. ............ 438/462 |
| 2003/0003724 A1 | * | 1/2003 | Uchiyama et al. ......... 438/667 |
| 2003/0119281 A1 | * | 6/2003 | Suzuki et al. .............. 438/460 |

OTHER PUBLICATIONS

R. Williams, Modern GaAs Processing Methods, Artech House, Inc. 1990.
R. Goyal, Monolithic Microwave Integrated Circuits: Technology & Design, Artech House, Inc. 1989.
J. Coburn, Plasma Etching and Reactive Ion Etching, American Vacuum Society Monograph Series, American Institute of Physics, 1982.
C. Su, M. Xi, Z. Dai, M. Vernon and B. Bent, "Dry etching of GaAs with C12: correlation between the surface C1 coverage and the etching rate at a steady state," Surface Science, 282, 357 (1993).

(Continued)

*Primary Examiner*—George Fourson
*Assistant Examiner*—Julio J. Maldonado
(74) *Attorney, Agent, or Firm*—Gerald B. Hollins; Thomas L. Kundert

(57) ABSTRACT

An etching based semiconductor wafer thinning arrangement usable as an improved alternative to the usual grinding and polishing wafer thinning. The thinned wafer includes a structurally enhancing wafer backside grid array of original wafer thickness semiconductor material with grid cells surrounding individual thinned wafer areas and serving to improve the strength and physical rigidity characteristics of the thinned wafer. Preferably this grid array is supplemented with an additional, wafer periphery-located, backside ring of semiconductor material also of original wafer thickness. Ability to avoid a wafer front side mounting during thinning accomplishment, fast etching, reduced wafer breakage, enhanced wafer strength and improved wafer handling achieved with the disclosed thinning arrangement all contribute to achieved advantages over conventional wafer thinning. Gallium arsenide or other semiconductor materials are contemplated along with use in radio frequency or other integrated circuit devices of either the single transistor or complete integrated circuit components types.

24 Claims, 3 Drawing Sheets

OTHER PUBLICATIONS

R Shul, A. Howard, C. Vartuli, P. Barnes and W. Seng, "Temperature dependent electron cyclotron resonance etching if InP, GaP, and GaAs," Journal of Vacuum Science & Technology (A), 14, 1102 (1996).

J. Lee and S. Pearton, "Investigation of masking materials for high ion density Cl2/Ar plasma etching of GaAs," Semiconductor Science & Technology, 11, 812 (1996).

* cited by examiner

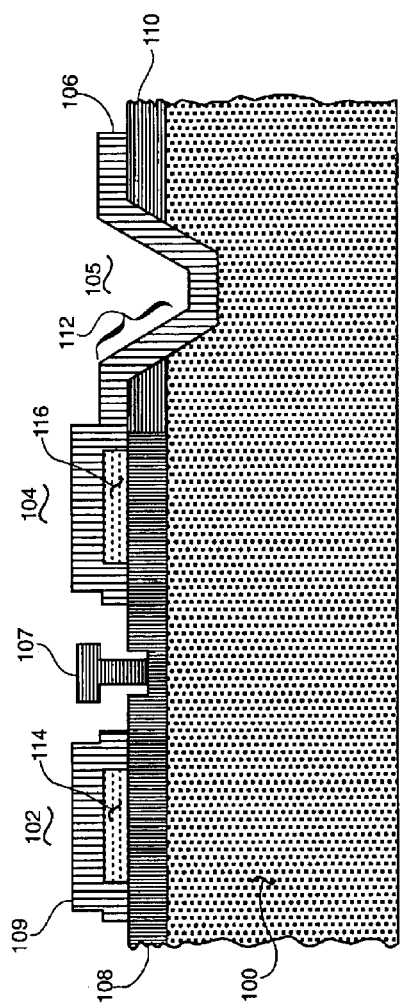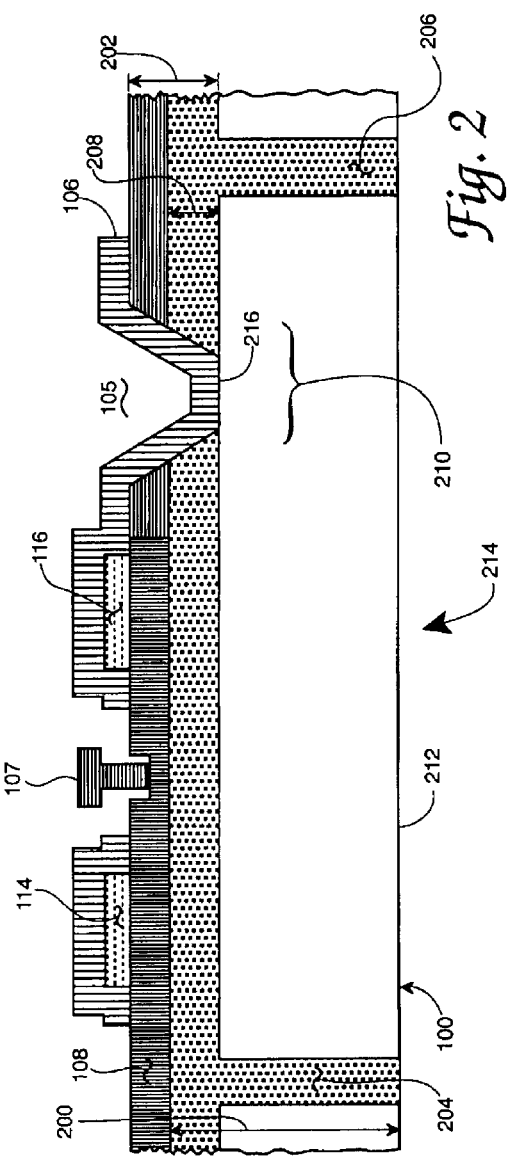

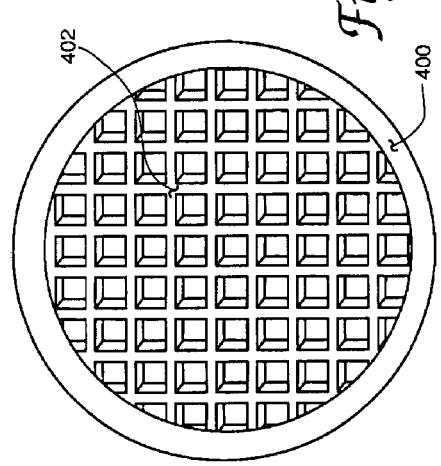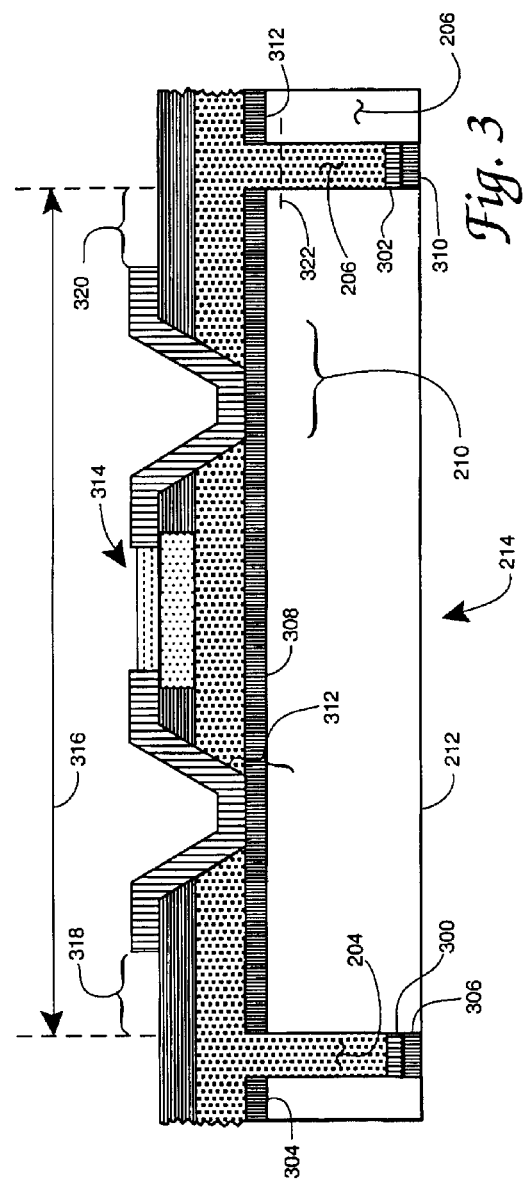

STIFFENED BACKSIDE FABRICATION FOR MICROWAVE RADIO FREQUENCY WAFERS

CROSS REFERENCE TO RELATED PATENT DOCUMENTS

The present document is somewhat related to the copending and commonly assigned patent application document "MEASURED VIA HOLE ETCHING", Ser. No. 10/034, 747 filed of even date herewith. The contents of this related, even filing date application, are hereby incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

Semiconductor wafers are normally cut at least 500 $\mu$m to 625 $\mu$m in thickness because this is considered the minimum thickness necessary to provide structural integrity during integrated circuit wafer processing. Thinner wafers usually break during processing, at which point processing of the wafer usually stops because it is not cost effective to process wafer pieces of irregular shape in a production line. For microwave frequency integrated circuit devices (usually circuits operable in the gigahertz frequency range such as Monolithic Microwave Integrated Circuits or MMIC's), the standard wafer thickness (e.g. 600 $\mu$m) is however too thick and thereby excessive device performance losses will occur. Therefore, in microwave circuits, the wafer should be thinned from its backside (the back of the wafer opposite of where the device/circuit is made) in order to reduce circuit inductance and device inductance and minimize radio frequency energy losses. Such wafers are usually thinned to 100 micrometers or even thinner, and require special handling during the backside operation and possibly during subsequent packaging, since the thinned wafers are so structurally weakened as to be quite fragile and unsound. Wafers thinned to as little as 25 to 50 micrometers of thickness have been suggested; such wafers are especially considered to be candidates for use of the present invention.

Normal present day thin wafer backside processing first requires mounting the wafer in a front side (device side) down position onto a wafer carrier (usually of quartz) using wax, and then the backside (with the carrier) can be processed as needed to thin the wafer to its desired thickness. This backside processing usually includes a plurality of grinding and polishing steps and may involve wet processing. This backside processing may also include the provision of via holes to allow a metal connection between the backside and the front side circuits (through the via hole). Once these backside steps have been completed, the wafer is then carefully dismounted from the carrier to make the device front side accessible again. This dismounting procedure is undesirably critical, and frequently results in wafer breakage, as the wafer is now very thin and has become structurally unsound. Furthermore, complete removal of the wax used to mount the wafer front side to the carrier is needed and this removal must be accomplished so as to not damage the devices where the wax was present.

SUMMARY OF THE INVENTION

The present invention provides a dry gas etching-based wafer thinning arrangement usable as an improved alternative to the usual grinding and polishing wafer thinning. In the present invention the wafer is provided with an array of backside support and rigidizing members enabling use of conventional wafer handling and processing notwithstanding its thinned and paper-like fragile nature. Selective backside etching of the wafer in the presence of both patterned and processing fixture-provided masking provides a residual array of interconnected backside support members which combine to make the wafer significantly less fragile and less damage susceptible in the whole wafer state than is possible with conventional thin wafer processes. The backside support members may be excluded in the wafer dicing operation where the accomplished small die size affords such die strength as to enable conventional die handing for packaging purposes.

It is therefore an object of the present invention to provide an improved integrated circuit wafer thinning process.

It is another object of the invention to provide a thinned integrated circuit wafer having enhanced breakage damage immunity.

It is another object of the invention to provide a wafer thinning process well suited for use with radio frequency integrated circuit devices.

It is another object of the invention to provide a wafer thinning process suited for use with any integrated circuit device needing a less than normal original wafer thickness.

It is another object of the invention to provide an etch-accomplished wafer thinning process.

It is another object of the invention to provide a high-speed etch-accomplished wafer thinning process.

It is another object of the invention to provide a wafer backside arrangement having a mask-determined backside-strengthening pattern.

It is another object of the invention to provide a wafer backside arrangement having a processing fixture-determined backside-strengthening pattern.

It is another object of the invention to provide a wafer backside arrangement having a mask-determined backside-strengthening pattern that is combined with a processing fixture-determined backside-strengthening pattern.

These and other objects of the invention will become apparent as the description of the representative embodiments proceeds.

These and other objects of the invention are achieved by radio frequency circuit die apparatus comprising the combination of:

a semiconductor wafer having a plurality of individual radio frequency electrical circuit devices received in individual die locations across a frontal surface thereof;

an array of recessed cavity regions disposed across a backside surface of said semiconductor wafer;

each said recessed cavity region of said backside array being disposed in lateral registration with one of said frontal surface radio frequency electrical circuit die locations and comprising a region of diminished wafer thickness and enhanced electrical and thermal performance for components of said registered frontal surface radio frequency electrical circuit device;

each said recessed cavity region in said backside array being bounded by a pattern of plateau cross-sectioned wafer material disposed in both lateral registration with a periphery of each said circuit die and in rigidifying physical strengthening of said circuit die and said region of diminished semiconductor wafer thickness.

BRIEF DESCRIPTION OF THE DRAWING

The accompanying drawings incorporated in and forming a part of the specification, illustrates several aspects of the present invention and together with the description serve to explain the principles of the invention in the drawings:

FIG. 1 shows a cross sectional view of a field effect transistor following transistor and front side via hole formation.

FIG. 2 shows the FIG. 1 transistor cross section following a backside etch according to the present invention.

FIG. 3 shows a cross sectional view of a thinned wafer after metallization.

FIG. 4 shows a full wafer backside grid pattern according to the present invention.

DETAILED DESCRIPTION OF THE INVENTION

Figure 5:
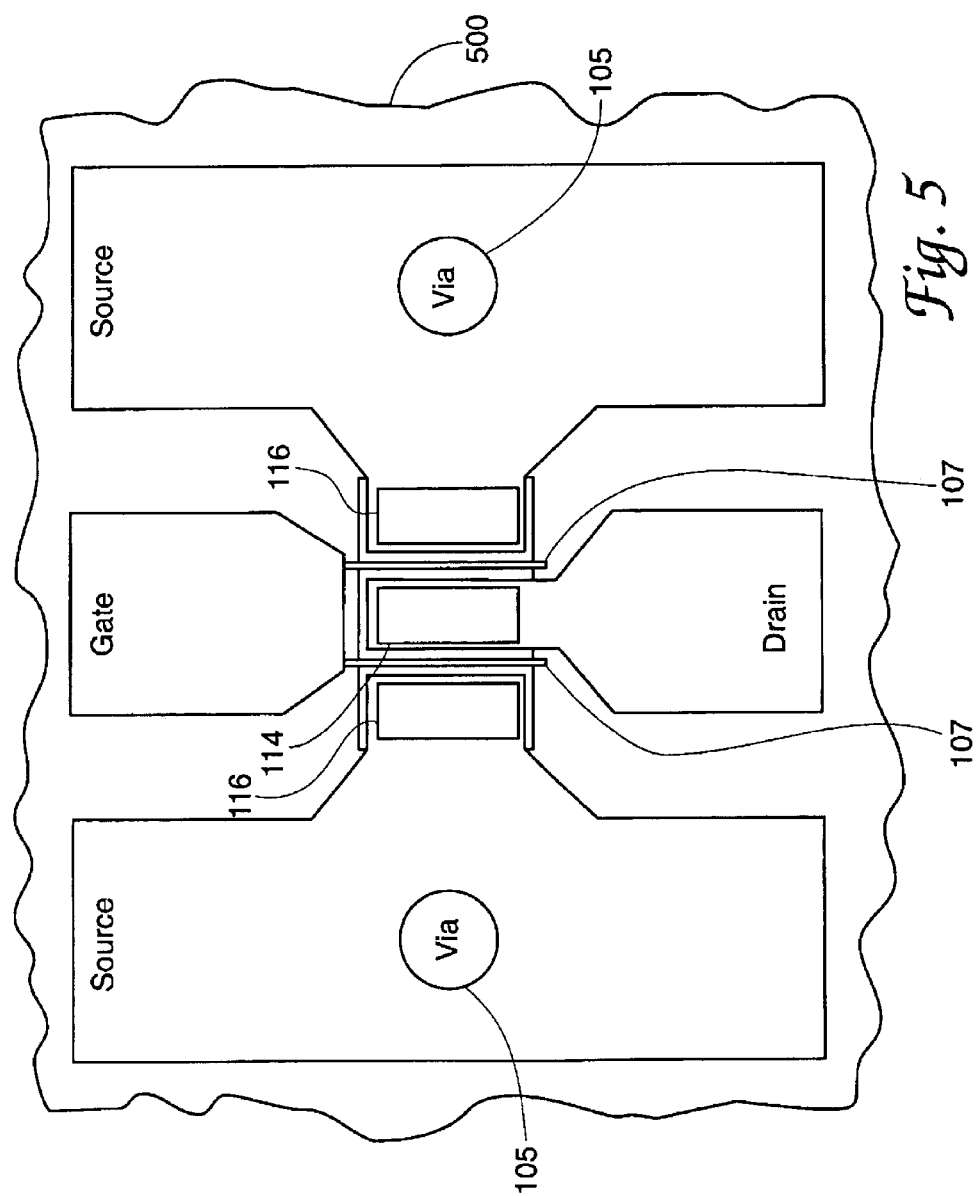
FIG. 5 shows a top view of a field effect transistor portion of an integrated circuit device according to the present invention.

FIG. 1 in the drawings shows a profile view of a field effect transistor of a type that may be employed in a radio frequency integrated circuit device. The FIG. 1 transistor is shown in a not to scale cross sectional view representing the state of the transistor following completion of the transistor fabrication sequence and representing partial accomplishment of the complete wafer multiple transistor fabrication process i.e., following completion of the wafer frontal side processing but prior to commencement of the wafer backside processing. In this state of completion several aspects of the present wafer backside invention may be conveniently viewed and discussed. The FIG. 1 transistor may be considered to be of gallium arsenide composition although transistors made of silicon and other materials are equally viable as hosts for the present invention. In FIG. 1 it is notable that via holes are normally formed on the backside of a wafer, after wafer thinning, and while the wafer is mounted face down on a carrier. As implied in FIG. 1 however the present invention forms the via holes on the wafer front side (1) BEFORE backside thinning and (2) without the need for backside alignment and wafer carrier mounting.

In view of the present invention interest in backside wafer details several different types of transistor may be substituted for the transistor shown in FIG. 1; these transistors may for example include the several transistors disclosed in a series of U.S. Patents involving the present inventors and additional inventors, U.S. Pat. Nos. 5,698,870; 5,698,900; 5,796,131; 5,869,364; 5,940,694 and U.S. Pat. No. 5,698,900. These transistors may also include transistors of the bipolar junction transistor (BJT) or heterojunction bipolar transistor (HBT) type and other transistors of the field effect type. Even though FIG. 1 and the other drawings herein show primarily a single transistor it is to be understood that the invention is also not limited to single transistor devices. The presence of other transistors and additional components is indicated by the broken enclosure line at 500 in FIG. 5 for example. The FIG. 1 transistor is therefore intended to be representative of the plural transistors, diodes, resistive and reactive elements, transmission lines and other components employed in a radio frequency or a microwave radio frequency circuit device.

In the FIG. 1 view of a typical radio frequency circuit transistor there is represented a layer of electrically isolated and semi-insulating substrate semiconductor material 100 a layer extending over the lateral extent of the wafer on which the FIG. 1 transistor is fabricated. Overlying the layer 100 is an active device area layer 108 in which current flows between a transistor drain region 102 and source region 104 as controlled by the potential applied to a gate 107. Transistor drain and source elements (i.e., metal ohmic contacts) 114 and 116 in the drain and source regions 102 and 104 are shown in FIG. 1 to be covered with a layer of metal 106. The ohmic contacts 114 and 116 are usually formed at the same time and alloyed together to form the ohmic connection. The metal 106 also extends into the via region 105, a localized recess through the layer 108 into the layer 100. Metal similar to the metal 106 is indicated at 109 in FIG. 1 and in addition to making contact with the source element 114 can serve to connect this source element to other portions of the integrated circuit. The metals at 106, 109 and the metals at 114, 116 are of course different in composition. Surrounding the via region 105 is a region of electrically isolating material 110 which has been changed from the layer 108 semiconductor material of the active device into a region of electrical isolation or insulation by a process of ion implantation with for example oxygen ions according to a process that is known in the art of semiconductor device fabrication. This isolation may also be accomplished by etching away (i.e. physical removal of) layer 108 material in the electrical isolation region.

In a wafer of radio frequency transistors and their associated circuit components the source contact 116 in the transistor source region 104 is often connected to an electrically grounded circuit node. Such a ground connection is implied in the FIG. 1 transistor by the joining of the source metallization and the via metallization in the region 112 since in the completed form of the FIG. 1 transistor the via metallization at 105 is connected with a ground plane member disposed on the transistor backside surface. The primary purpose of the via aperture or intrusion at 105 is in fact to accomplish such a transistor source to ground plane connection. Multiple via and ground plane connections for each transistor and for other transistors in a wafer of FIG. 1 devices are of course contemplated.

The present invention is concerned with the backside surface processing of the FIG. 1 transistor, the processing by which the FIG. 1 substrate 100 is thinned or reduced in thickness from the 500 to 625 micrometer thickness represented in FIG. 1 to a thickness in the range of 100 micrometers or less as is more suited for electrical and thermal dissipation purposes in a radio frequency transistor device and as is represented in the FIG. 2 drawing. Although substrate thinning has been practiced heretofore such thinning has largely been accomplished through use of grinding and polishing steps rather than through use of an etching sequence as employed in the present invention. As disclosed in connection with FIG. 2 and in the following paragraphs the use of etching for wafer backside thinning purposes also enables the formation of desirable physically strengthening shapes in the backside material of the FIG. 1 transistor. In a thinned wafer, which may be of approximately the thickness of a sheet of paper and may have a diameter of three inches or six inches for example, these physically strengthening shapes are of significant assistance in preventing wafer breakage and otherwise in the course of wafer handling. Significantly, these benefits are achieved without the need for wafer mounting to a carrier member.

FIG. 2 in the drawings shows the appearance of the FIG. 1 transistor following a wafer thinning sequence according to one aspect the present invention. In the FIG. 2 drawing the original wafer thickness of 500 to 625 micrometers at 200 has been reduced to a thickness in the range of 100 micrometers or less as is represented at 202. The thickness at 202 includes the substrate remainder at 208 and the unetched active material layers at 108. According to the present invention the FIG. 2 thickness reduction or thinning has been accomplished through use of a wafer backside etching sequence, preferably a dry gas reactive ion etching sequence. Although this etching sequence may be of the well known in the art reactive ion etching variety such ordinary etching is of such a slow rate of semiconductor material removal as to make removing of the presently espoused 400–500 micrometers of gallium arsenide or other semiconductor material impractically slow for use in a non-laboratory environment. Such conventional reactive ion etching could require etching times in the range of several hours or more for each wafer for example. Preferably the etching represented in FIG. 2 is therefore accomplished with the faster etching rates provided by a high density plasma as accomplished in the inductively coupled plasma, ICP, etching method or the electron cyclotron resonance, ECR, etching methods. Both of these etchings are considered to be of the high-density plasma reactive ion etching type. The FIG. 2 etching is preferably of the anisotropic vertical wall-achieving type rather than of the isotropic variety usually achieved with wet chemical processes.

Inductively coupled plasma etching is disclosed in a number of U.S. patent documents including the U.S. Pat. No. 4,142,004 of Hauser et al., U.S. Pat. No. 4,431,898 of Reinberg et al., U.S. Pat. No. 4,624,736 of Gee et al., U.S. Pat. No. 6,257,168 of Ni et al., U.S. Pat. No. 6,258,287 of Martin et al., U.S. Pat. No. 6,258,728 of Donohoe et al. and U.S. Pat. No. 6,259,209 of Bhardwaj et al. The earlier of these patents disclose the use of inductively coupled plasma in a plasma torch setting. These patents are hereby incorporated by reference herein. In a similar manner electron cyclotron resonance is disclosed in a number of U.S. patent documents including the U.S. Pat. No. 4,401,054 of Matsuo et al., U.S. Pat. No. 4,438,368 of Abe et al., and the previously identified U.S. Pat. No. 6,258,287 patent of Martin et al. These patents are also hereby incorporated by reference herein. While on the subject of prior patents it may also be relevant that the U.S. Pat. No. 5,512,496 of Chau et al. discloses the fabrication of a gallium arsenide bipolar transistor having a wafer backside recess. The disposition of a collector terminal in the backside recess and the limited bipolar nature of the Chau et al. transistor appear to be limiting features with respect to the present invention however.

Continuing with discussion of FIG. 2 and other present document drawings, the herein desired backside etching sequence employs a masking array disposed to leave a closed grid pattern of original thickness substrate semiconductor material as is represented by the regions 204 and 206 and by the line 212 in the FIG. 2 drawing. A typical full wafer plan view of this remaining substrate grid pattern is shown in the FIG. 4 drawing where the grid pattern may be regarded as having a waffle-like appearance. As may also be observed in this FIG. 4 drawing this substrate grid pattern further includes a wafer encircling ring 400 of original thickness substrate material resulting from the footprint of a chuck used to hold the wafer during the reactive ion etching process, as described below herein. Alternately this encircling ring can be achieved by adding such a ring element to a mask used during achievement of the FIG. 4 grid pattern.

It is the combination of the rectangular grid pattern 402 and the encircling ring 400 in the FIG. 4 drawing, as these elements are embodied in original thickness semiconductor material, which provides the most desirable rigidizing and strengthening of the semiconductor wafer in the present invention. Although either of these original wafer thickness backside patterns may be used alone to significant advantage over other wafer configurations, the combination of the two backside patterns provides the most rigid, damage resistant and easily handled wafer.

Smaller semiconductor wafer embodiments of the FIG. 4 wafer often include a wafer flat extending tangentially along one edge of the wafer for the purpose of wafer orienting in processing and holding apparatus. According to present day practice such wafer flats are often used with four inch and smaller wafers but may be omitted in larger sized wafers where their presence causes a significant loss of usable wafer area. When such flats are used the employed wafer chuck is usually provided with a corresponding flat and this leads to the present invention result that the encircling ring 400 in the FIG. 4 drawing takes on a "flat tire" appearance. For the sake of simplicity such flats are ignored in the language and drawings of the present document however it is contemplated that both the circular and the flattened wafers come within the scope of the invention.

As shown in the FIG. 2 drawing the line 212 may now be understood to represent an endwise portion of the wafer backside grid pattern 402 as well as the encircling ring 400 both of which appear in the FIG. 4 drawing. In the FIG. 2 drawing the thickness extent of the remaining substrate material is indicated at 208 and the thickness of the substrate and the transistor active region is indicated at 202. As represented by these thickness dimensions one aspect of the present invention involves the preferred termination of the backside etching and thinning process when the etching has traveled from the lower surface of the wafer at 214 and reached the lower surface of the via hole metallization at 216. In fact it is contemplated that termination of the backside etching should occur precisely when the etching process has reached the via hole metallization represented at 216 or after an appropriate and equivalent etching-accomplished time interval when the etch rate and the etch depth are each known with accuracy. With this termination the exposed lower surface of the via hole metallization at 216 is available for making connection with the ground plane metallization in the manner shown at 312 in the FIG. 3 drawing.

Although etching termination upon reaching the via hole metallization is desirable in the invention it is not a requirement and indeed other etching terminations are feasible. These terminations may include etch stopping prior to reaching the via hole metal or etch stopping after reaching the via hole metal so that a wafer thickness less than the via hole metal depth is realized. The vernier etch depth markers of the copending U.S. Patent application of several of our inventor colleagues and inventors common with the present patent document, U.S. application Ser. No. 10/034,747 may be used in controlling the etching depth achieved. The contents of this copending patent application are hereby incorporated by reference herein.

FIG. 3 in the drawings shows a transistor of the FIG. 1 and FIG. 2 type in a representation drawn to a slightly smaller scale in order to show several additional details. Specific drain, source and gate areas are not shown in FIG. 3, but are incorporated between source vias in layer 314. In the FIG. 3 drawing the wafer backside etching is completed and the metal mask portions used to protect the pattern of original thickness substrate semiconductor material in the regions 204 and 206 of FIG. 2 during this etching is shown at 300 and 302. This mask metal may be of Ti/Au or Ti/Ni or Ni or Cr materials or other materials known in the art. This mask metal has been allowed to remain in position in the FIG. 3 drawing and is covered by the layer of ground plane metal represented at 304, 306, 308, 310 and 312. This ground plane metallization has also been allowed to come into intimate electrical connection with the via hole metallization as shown at 312 in the FIG. 3 drawing. The via hole metallization in the FIG. 3 transistor is connected with two locations in the transistor located in the active device area 314 of the FIG. 3 drawing; these two locations may be for example two differing terminations of the transistor source electrode as appear in the FIG. 5 drawing herein and as is commonly practiced with radio frequency transistors.

It is perhaps worth noting that the FIG. 3 metal mask portions at 300 and 302 used to protect the pattern of original thickness substrate semiconductor material in the regions 204 and 206 during etching never extends into the via region 210 or other areas intermediate the "upstanding" original thickness substrate semiconductor material of regions 204 and 206. The overlying metallization layer is however blanket in nature and covers the entire wafer backside and thus extends into the areas intermediate the "upstanding" original thickness substrate semiconductor material of regions 204 and 206 as shown in the FIG. 3 drawing. It is thus according to the invention the metallization of layers 306 and 310 as represented at 308 which accomplishes the via hole metallization contact in the region 210 of FIG. 2 and FIG. 3.

The lateral extent of the transistor or integrated circuit represented in the FIG. 3 drawing is indicated by the dimension line 316 and extends generally to the innermost location of the semiconductor substrate regions of original thickness at 204 and 206 in FIG. 3. Included in this lateral extent are the "saw street" wafer frontal side regions 318 and 320 wherein no active part of the transistor is disposed: these regions may be used for the saw cuts or scribe marks used to divide the wafer of the FIG. 3 drawing into individual circuit die. This disposition of the saw cut regions within the bounds of the backside grid pattern and the semiconductor regions 204 and 206 of course means that the sawed or scribed circuit die is segregated from the strengthening effects of the grid pattern when finally segregated from the wafer. This is not a problem since the single die size is so small, and normally on the order of a few millimeters or tens of millimeters in size, that even the thinned wafer is possessed of sufficient rigidity and strength to withstand the limited abuse of an integrated circuit packaging operation. In other words, the heretofore-mentioned wafer fragility and damage susceptibility occur primarily when the wafer, and its numerous integrated circuits or transistors, are in the thinned but undivided or whole-wafer state.

The process steps usable to fabricate the present wafer backside invention may be summarized as follows. These steps assume a standard wafer front side processing has been completed, and the active devices and passive components have already been formed. The steps recited here highlight where the present invention backside processing varies from standard backside processing that would usually occur at this time.

1. Front side Via Hole Definition: Use standard photolithographic techniques to define via holes and align with source contact pads outside the active area of the device. Since this alignment occurs to the wafer front side, no special alignment procedures are needed. Infrared or precision camera alignment techniques, as are normal for backside alignment, are not needed in this instance when the substrate is for example of gallium arsenide material.

2. Via Hole Formation: The wafer is etched using reactive ion etching to form the conical trench or sloped non-vertical sidewalls in the locations defined in step 1. The final depth of the via hole is preferably the final wafer thickness after the wafer backside has been thinned. A wet etch could also be done along crystallographic planes to attain these non-vertical sidewalls however a RIE and a more isotropic etch is believed preferable.

3. Via Hole Metallization: Metal is deposited into the via hole defined lithographically in step 1 and formed in step 2; this metal overlaps the source metal contact pads formed earlier. Note that this via hole metallization may be combined with normal contact pad metallization in the drain and source regions, 102 and 104 in FIG. 1, metallization used to communicate the gate, drain, and source elements from the active regions onto electrically isolated regions for contact to other components of the integrated circuit and to the outside by for example wire bonding to the chip package.

4. Backside Grid Pattern Definition: Photolithographically define the grid pattern on the wafer backside. This may use an infrared mask aligner in order to communicate through a gallium arsenide wafer or may use a precision camera apparatus to align the grid pattern on the backside to correspondence with the saw streets (such as the frontal side regions 318 and 320). The grid pattern widths can however be very large (50–100 micrometers in width), and since these occur outside of the device or integrated circuit area, the alignment is not critical and a course alignment is sufficient.

5. Grid Pattern Mask Formation: Metal is deposited onto the grid pattern formed in step 4. This metal grid pattern is used as the etch mask which will block the etching and form the rigid semiconductor grid pattern structure beneath the metal mask to maintain structural integrity of the wafer. Since the etching of the wafer requires removal of a large amount of material (e.g., 500 micrometers), a metal mask is needed to maintain the grid pattern definition during etching.

6. Wafer Backside Thinning: The wafer is loaded into a high density plasma etching system such as an inductively coupled plasma (ICP) or an electron cyclotron resonance (ECR) reactive ion etching (RIE) system, where a high density plasma is used to chemically etch the exposed wafer as defined by the metal mask grid pattern formed in step 5. The RIE machine loads the wafer into the process chamber and clamps the wafer by use of for example an alumina clamp which has a slightly smaller diameter than the wafer itself (about 5 millimeters smaller), such that the outside 5 millimeters of the wafer is additionally masked by the clamp and is not etched during the process. This outside ring of unetched material. i.e. the ring 400 in the FIG. 4 drawing, combined with the unetched material grid pattern, 402 in FIG. 4, formed by the metal mask from step 5, allows for a thinned wafer to be processed and remain structurally sound without requiring mounting to a wafer carrier.

One characteristic of reactive ion etching is its ability to anisotropically etch material, such that the etch profile at a mask edge remains essentially vertical, and the mask pattern as formed remains intact. The etch can be timed since the etch rate is well known, and may be in-situ monitored either by eye or by a video camera (or by other means such as a reflectometer or ellipsometer) to observe when the front side metal via holes formed in step 3 appear on the backside as the wafer is etching. Then, the etching process can be stopped (either through timing alone, or by a observation of the front side metal via holes "coming through"). Further etching may be considered if a thinner wafer is desired, but the protruding via hole metal will not be etched and so the via hole itself will remain intact as previously formed. This is because the exposed metal is generally unaffected by the backside wafer chemical etching thinning process.

7. Wafer Backside Metallization: Metal is deposited without masking to the entire backside of the wafer, making electrical connection to the front side by contacting the front side via holes metal.

8. From this stage, the processing continues with electrical testing, dicing/sawing, and packaging of individual circuit die as in the standard process. It is notable however that there is no need to dismount the wafer from its carrier to perform this continued processing, and the wafer may be handled as a standard (unthinned) wafer during this continued processing period.

With respect to step 8 in this process it may at first blush appear that recitation of a carrier in connection with dicing/ sawing of the individual circuit die is in conflict with other recitations herein wherein the absence of a wafer carrier in the present invention processing is emphasized. It is true that the present invention requires no wafer carrier of for example the quartz or glass type as are used (with a wax attachment) during the earlier steps of wafer fabrication however during the final steps of fabrication, when the completed wafer is to be segregated into individual circuit die, it is common practice in the art and contemplated in this invention to attach the wafer, by adhesive means for example, to a flexible "carrier" in order to capture the individual circuit die after their segregation has been accomplished. A "blue tape" carrier is often used for this die segregation substrate function and it is such a "carrier" that is referred-to in the step 8 processing above.

With respect to the step 6 discussion in this process and the structural soundness of the wafer backside arrangement shown for example in the FIG. 3 and FIG. 4 drawings, it may be appreciated that the "upstanding" semiconductor material of regions 204 and 206 and the ring 400 add a significant degree of stiffening to the otherwise paper thin and flexible thinned wafer. These "upstanding" regions of height some four to five times the thinned wafer thickness may be appreciated to act in the manner of the web portion of a structural "I" beam in placing the uppermost and lowermost portions of the regions 204 and 206 semiconductor material at relatively great distances from a structural neutral axis (a neutral axis wherein neither compression nor tensile stresses occur, an axis located for example at 322 in the FIG. 3 cross sectional view of the wafer assembly). Such placement tends to stretch and compress the semiconductor material of the uppermost and lowermost portions of the regions 204 and 206 to a greater degree than the other semiconductor material in the FIG. 3 drawing during a wafer bending event and thereby results in the rigidity known for "structural" shapes in the civil and mechanical engineering arts. A similar effect explains the greater structural rigidity achieved by corrugating a thin piece of sheet metal or by corrugating the sides of a tin can or by the ridge and valley pattern used in the trunk flooring and other large flat surface areas of an automobile. These uppermost and lowermost portions of the regions 204 and 206 semiconductor material, with their displacement from the structural neutral axis, may in fact be compared with the action of "I" beam flanges in their stiffening and load-carrying action. Notably the "upstanding" semiconductor material of regions 204 and 206 and the ring 400 and the wafer strengthening benefits thereof are not possible in a wafer thinned by a conventional grinding and polishing process.

FIG. 5 in the drawings shows a completed wafer front side view of the FIG. 1 and FIG. 2 transistor including additional details of the gate arrangement, the double source connection, the drain connection and the via hole locations. Using one via hole as a reference it is possible to physically relate elements in the FIG. 5 drawing to the FIG. 1 and FIG. 2 drawings. As indicated by the broken perimeter 500 in the FIG. 5 drawing the single transistor shown is a portion of a larger integrated circuit wafer which may include other transistors and additional components such as radio frequency circuit elements as described above. The FIG. 5 transistor is of the two-finger gate type. Most number-identified transistor elements shown in FIG. 5 correspond to numbers first recited in connection with the FIG. 1 drawing.

SUMMARY/CONCLUSIONS

The wafer backside processing of the present invention therefore avoids mounting the wafer to a carrier and avoids the use of mounting wax. With use of the invention, backside processing occurs in the normal fashion of front side processing. With the invention wafer via holes are formed from the front side instead of from the backside and are metallized before backside processing occurs. This front side via hole formation can be used to establish the final depth of the wafer after thinning, since the metallization of the via hole may be used during the backside thinning (etching) process as an etch stop indicator. The backside of the wafer is patterned with a metal mask which forms a grid pattern across the wafer surface, and whose pattern is aligned with the outside border region of each integrated circuit present on the wafer. Since each wafer consists of repetitions of the same identical circuit in an ordered, rectangular grid pattern, this pattern lends itself automatically to be used to form the backside grid pattern needed to maintain structural integrity. The backside pattern is comprised of both the rectangular grid and an enclosing perimeter structure either of which may be used to some advantage alone but which are especially desirable when used in combination.

According to additional aspects of the invention only the wafer region directly under the integrated circuit needs to be thinned, so the outside border region between each integrated circuit can remain unetched and at the original substrate thickness to maintain wafer rigidity. After metal grid patterning of the wafer backside (patterning aligned to the borders surrounding the integrated circuit regions), inductively coupled plasma (ICP) reactive ion etching (RIE) or equivalent and dry gases are used to etch (thin) the backside of the wafer to the desired thickness. The metal grid pattern is essentially not etched by the chemical gases used, so regions directly under the metal grid pattern remain at the original substrate thickness. The etch depth is determined by timing the etching process using the known etch rate of the chemical reaction with the gases and the substrate material. However, since the vias have already been formed and metallized on the front side, when the etching process reaches the lowest part of the metal via hole, the etching action stops at the via metal and does not destroy the via hole itself. Further etching may cause the wafer to become too thin, but the via metal can be used as an easy indicator as to when to stop the etching process. After etching, the wafer is removed from the RIE apparatus and is ready for dicing and packaging. The thinned wafer does not require dismounting from a carrier and can be handled in the manner of standard wafer processing.

Differences between the present invention new wafer backside processing and the conventional wafer backside processing may be additionally appreciated from the comparisons

| Present Invention Backside Process | Standard Backside Process |
|---|---|
| 1. Perform front side alignment and etch via holes | 1. Mount wafer front side down with wax onto wafer carrier |
| 2. Metallize wafer front side and form via holes. | 2. Mechanically (or chemo-mechanically) polish wafer backside to thin wafer |
| 3. Perform non-critical backside alignment and put down metal mask on wafer backside. | 3. Perform backside alignment and etch via holes from backside |
| 4. Etch (thin) wafer backside using RIE and stop on metal via holes from front side (built-in etch stop on metal via). | 4. Metallize wafer backside making contact to front side through vias. |
| 5. Metallize wafer backside as mounted. | 5. Dismount completed and thinned wafer from carrier. |

| Present Invention Backside Characteristics | Standard Backside Characteristics |
|---|---|
| No wafer mounting of wafer front side (device side) with wax. | Wafer mounting of wafer front side with wax required. |
| Via hole process on front side does not require special alignment between backside and front side to form via holes. | Backside via hole process requires special alignment (infrared optics) from backside to front side to form via holes. |
| Wafer thinning is a chemical process and provides uniform thickness across the substrate with lower surface roughness. | Wafer thinning is a physical process and creates thickness variations across the substrate with noticeable surface roughness. |
| | Non-uniform wafer thickness results in non-uniform via hole formation, which may cause parasitic losses to the circuit at very high frequencies ($\geq 100$ GHz). |
| Built-in etch stop from front side via hole formation minimizes overetching of via holes and maintains proper proportions across the wafer. | Backside thinning process may over-etch via holes and cause non-uniform variations across the wafer. |
| In-situ monitoring of RIE process is possible to determine correct wafer thickness in real time. | No direct in-situ monitoring of the polishing (thinning) process is possible. |
| No dismounting of thinned wafer is necessary. | Dismounting of fragile thinned wafer required before packaging |
| No wax is used; wax does not contaminate the wafer device front side. | Complete wax removal necessary to prevent damage to devices on front side. |
| Finished wafer is structurally sound due to unetched grid pattern and ring (of full substrate thickness). | Finished wafer is fragile and cannot be handled without underlying mechanical support. |
| Unetched grid pattern is of wide tolerance, easily fabricated dimensions. | Wafer thinned by grinding and polishing excludes strengthening and stiffening grid pattern elements. |

The foregoing description of the preferred embodiment has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular scope of the invention as determined by the appended claims when interpreted in accordance with the breadth to which they are fairly, legally and equitably entitled.

We claim:

1. The method of fabricating a backside surface of a wafer of microwave radio frequency circuit die, said method comprising the steps of:

forming an array of via holes of selected location and depth dimension in said wafer of circuit die;

said via holes being located in response to selected microwave radio frequency electrical component locations over said front side surface of said wafer circuit die;

said step of forming an array of via holes being performed during a front side accessing of said wafer of circuit die;

disposing a grid pattern mask on said backside surface of said wafer of microwave radio frequency circuit die;

said grid pattern mask including a backside periphery outline masking for each circuit die of said wafer;

removing a layer of selected thickness from said wafer backside surface, said removing being from exposed backside surface areas intermediate elements of said grid pattern mask;

said removing step leaving recessed valley portions of selected thickness disposed intermediate individual circuit die-strengthening upstanding surrounding bluff masked semiconductor regions in said wafer backside surface and exposing backside portions of said formed front side via holes; and interconnecting front side and back side ground plane microwave radio frequency energy conveying metal conductors of said wafer circuit die by way of metallic conductors traversing said via holes.

2. The method of fabricating a backside surface of a wafer of microwave radio frequency circuit die of claim 1 wherein said wafer has an initial overall thickness between five hundred and six hundred twenty five micrometers and has a final thickness of between twenty five and one hundred micrometers in said removed layer recessed valley portions.

3. The method of fabricating a backside surface of a wafer of microwave radio frequency circuit die of claim 1 wherein said step of forming an array of via holes is performed during one of before fabrication of said microwave radio frequency circuit on said die and after fabrication of said microwave radio frequency circuit on said die.

4. The method of fabricating a backside surface of a wafer of microwave radio frequency circuit die of claim 1 further including the step of forming an etching dimension vernier marker pattern in each die backside surface of said wafer after said step of forming an array of front side via holes.

5. The method of fabricating a backside surface of a wafer of microwave radio frequency circuit die of claim 1 wherein said backside periphery outline masking is disposed in a closed geometric pattern encircling each front side microwave radio frequency circuit die and further including a closed geometric pattern backside annular ring of original wafer thickness semiconductor material surrounding said entire wafer of microwave radio frequency circuit die.

6. The method of fabricating a backside surface of a wafer of microwave radio frequency circuit die of claim 1 wherein said step of removing a layer of selected thickness from said wafer backside surface includes a backside surface etching step.

7. The method of fabricating a backside surface of a wafer of microwave radio frequency circuit die of claim 6 wherein said backside surface etching step comprises a dry gas etching sequence.

8. The method of fabricating a backside surface of a wafer of microwave radio frequency circuit die of claim 7 wherein said backside surface etching step includes one of an inductively coupled plasma and an electron cyclotron resonance fast etching processes.

9. The method of fabricating a backside surface of a wafer of microwave radio frequency circuit die of claim 1 wherein said removing step individual circuit die-strengthening upstanding surrounding bluff masked regions further include a wafer periphery-surrounding annular ring upstanding bluff region.

10. The method of making a thinned semiconductor wafer radio frequency integrated circuit device of damage resistant physical integrity, desirable high frequency electrical characteristics and favorable thermal energy dissipating characteristics, said method comprising the steps of:

fabricating electrical circuit portions of said thinned semiconductor wafer radio frequency integrated circuit device on a frontal side of a nominal thickness semiconductor wafer, each said integrated circuit device being disposed in a separate die location of said semiconductor wafer and including a plurality of contact pads;

forming a plurality of via hole intrusions through said nominal thickness semiconductor wafer in locations registered with selected of said contact pads of said integrated circuit device;

said via hole intrusions being formed from said frontal side of said nominal thickness semiconductor wafer;

metallizing said via hole intrusions, said metallizing including establishing via metal electrical connections with selected of said contact pads;

depositing a mask of grid pattern-defining configuration on said wafer backside surface;

said mask of grid pattern-defining configuration determining a plurality of wafer backside grid cells each aligned in surrounding periphery with one of said wafer frontal surface integrated circuit devices;

removing a controlled thickness amount of semiconductor wafer backside surface semiconductor material within each said backside grid cell, said removing including an etching step and leaving a wafer backside grid pattern of semiconductor material of said semiconductor wafer nominal thickness dimension and leaving a selected thickness remainder amount of semiconductor wafer nominal thickness dimension material, within each said backside grid cell, supporting each said integrated circuit device;

said removing step also exposing wafer thickness-received portions of said front side via hole intrusions metallization;

said etching step also leaving a wafer perimeter-disposed backside ring of wafer semiconductor material of said semiconductor wafer nominal thickness dimension and integral interconnection with said wafer backside grid pattern of wafer nominal thickness dimension;

said wafer perimeter-disposed backside ring of wafer semiconductor material of said semiconductor wafer nominal thickness dimension and said wafer backside grid pattern of wafer nominal thickness dimension semiconductor material in interconnecting combination adding physical handling-assisting substantial physical integrity and rigidity to said now thinned semiconductor wafer;

covering said thinned semiconductor wafer backside including said wafer backside grid pattern cells with a layer of ground plane metal, said covering including forming metal-to-metal ground plane electrical interconnections with said via hole intrusions metallization;

mounting said wafer on said frontal surface thereof; and further processing said wafer during continued frontal surface mounting, said further processing including removing each integrated circuit device die from said wafer by wafer segregation within a lateral extent of a backside grid cell.

11. The method of making a thinned wafer radio frequency integrated circuit device of claim 10 wherein said step of forming a plurality of via hole intrusions into said semiconductor wafer includes;

disposing said via hole intrusions to a first depth dimension into said semiconductor wafer; and wherein said selected thickness remainder amount of said semiconductor wafer nominal thickness dimension material in said step of removing a controlled thickness amount of said wafer backside semiconductor material within each said backside grid cell comprises leaving a selected thickness remainder amount of said wafer nominal thickness equal to said via hole intrusions first depth dimension into said semiconductor wafer.

12. The method of making a thinned wafer radio frequency integrated circuit device of claim 11 wherein:

said semiconductor wafer of nominal thickness is between five hundred and six hundred twenty-five micrometers in thickness; and wherein said selected thickness remainder amount of said wafer nominal thickness and said via hole intrusions first depth dimension are each no more than one hundred micrometers.

13. The method of making a thinned wafer radio frequency integrated circuit device of claim 10 wherein said radio frequency integrated circuit device is comprised of one of field effect and bipolar junction and heterojunction bipolar transistors.

14. The method of making a thinned wafer radio frequency integrated circuit device of claim 10 wherein said depositing step mask is a metallic mask.

15. The method of making a thinned wafer radio frequency integrated circuit device of claim 10 wherein said removing step etching comprises an anisotropic etching, dry gas, reactive ion, plasma etching sequence.

16. The method of making a thinned wafer radio frequency integrated circuit device of claim 15 wherein said anisotropic etching, dry gas, reactive ion, plasma etching sequence comprises one of an inductively coupled plasma (ICP) and an electron cyclotron resonance (ECR) high density plasma etching sequences.

17. The method of making a thinned wafer radio frequency integrated circuit device of claim 10 wherein said covering step forming of ground plane electrical interconnections comprises covering underside portions of etching-exposed second smaller diameter via hole metallizations with ground plane metal.

18. The method of fabricating a thinned microwave radio frequency semiconductor wafer of significantly retained original wafer physical strength properties, said method comprising the steps of:

defining an array of circuit die locations and circuit die segregation boundaries across a frontal surface of said semiconductor wafer;

forming a circuit die having a plurality of electrical components and front side-received via hole throughways in each frontal surface circuit die location of said semiconductor wafer;

disposing a mask inclusive of mask elements in registration with said circuit die segregation boundaries across a backside surface of said semiconductor wafer; and removing wafer-thinning backside selected thickness portions of said wafer from regions intermediate said mask elements and thereby unprotected by said mask;

said removing step leaving a physical strength preserving upstanding integrally interconnected mesa array of original wafer thickness extent in registration with said circuit die segregation boundaries across said semiconductor wafer backside surface and exposing wafer thickness-received portions of said front side-received via hole throughways and;

covering said thinned wafer backside with ground plane metal, metal extending through said via hole throughways to said frontal surface of said semiconductor wafer.

19. The method of fabricating a thinned microwave radio frequency semiconductor wafer of significantly retained original wafer physical strength properties of claim 18 wherein said array of circuit die locations and circuit die segregation boundaries defined across a frontal surface of said semiconductor wafer and said upstanding mesa array of original wafer thickness extent across said backside surface each comprise a rectangular grid pattern.

20. The method of fabricating a thinned microwave radio frequency semiconductor wafer of significantly retained original wafer physical strength properties of claim 18 wherein said step of forming a circuit die having a plurality of electrical components and front side-received via hole throughways in each frontal surface circuit die location of said semiconductor wafer comprises fabrication of radio frequency circuit die having via aperture-measuring graduated dimension metallic patterns disposed within said via hole throughways in thinned portions of said wafer.

21. The method of fabricating a thinned microwave radio frequency semiconductor wafer of significantly retained original wafer physical strength properties of claim 20 wherein said mask of said step of disposing a mask inclusive of mask elements in registration with said circuit die segregation boundaries across a backside surface of said semiconductor wafer further includes a mask element peripherally surrounding said wafer.

22. The method of fabricating a thinned microwave radio frequency semiconductor wafer of significantly retained original wafer physical strength properties of claim 18 wherein said step of removing wafer-thinning backside selected thickness portions of said wafer includes one of an inductively coupled plasma (ICP) and an electron cyclotron resonance (ECR) high density plasma etching sequences.

23. The method of fabricating a thinned microwave radio frequency semiconductor wafer of significantly retained original wafer physical strength properties of claim 18 wherein said method further includes segregating said circuit die into individual integrated circuits each exclusive of any portion of said wafer backside integrally interconnected upstanding mesa array of original wafer thickness extent.

24. The method of fabricating a thinned microwave radio frequency semiconductor wafer of significantly retained original wafer physical strength properties of claim 18 wherein said semiconductor wafer is comprised of one of silicon and gallium arsenide semiconductor materials.

* * * * *